(12) United States Patent
Wang et al.

(10) Patent No.: US 11,569,406 B2
(45) Date of Patent: Jan. 31, 2023

(54) PIN DEVICE AND MANUFACTURING METHOD THEREOF, PHOTOSENSITIVE DEVICE AND DISPLAY DEVICE

(71) Applicant: BOE Technology Group Co., Ltd., Beijing (CN)

(72) Inventors: Guoqiang Wang, Beijing (CN); Jiushi Wang, Beijing (CN); Qingzhao Liu, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 9 days.

(21) Appl. No.: 16/763,178

(22) PCT Filed: Dec. 19, 2019

(86) PCT No.: PCT/CN2019/126653
§ 371 (c)(1),
(2) Date: May 11, 2020

(87) PCT Pub. No.: WO2020/192194
PCT Pub. Date: Oct. 1, 2020

(65) Prior Publication Data
US 2021/0226079 A1    Jul. 22, 2021

(30) Foreign Application Priority Data
Mar. 26, 2019  (CN) .......................... 201910233511.0

(51) Int. Cl.
*H01L 31/105*  (2006.01)
*H01L 31/115*  (2006.01)
*H01L 31/18*   (2006.01)

(52) U.S. Cl.
CPC ........ *H01L 31/1055* (2013.01); *H01L 31/105* (2013.01); *H01L 31/115* (2013.01); *H01L 31/1804* (2013.01)

(58) Field of Classification Search
CPC . H01L 31/1055; H01L 31/1804; H01L 31/115
See application file for complete search history.

(56) References Cited

U.S. PATENT DOCUMENTS

2002/0000510 A1* 1/2002 Matsuda ............... H01L 31/105
                                                        250/214.1
2006/0060933 A1* 3/2006 Gao ...................... H01L 31/105
                                                        257/458

(Continued)

FOREIGN PATENT DOCUMENTS

CN       103400872      *  11/2013
CN       104064610      *   2/2017

(Continued)

OTHER PUBLICATIONS

Guo et al., "Current Kink and Capacitance Frequency Dispersion in Silicon PIN Photodiodes" Electron Devices Society, vol. 5, No. 5 . (Year: 2017).*

(Continued)

*Primary Examiner* — Ahmed N Sefer
(74) *Attorney, Agent, or Firm* — Arch & Lake LLP

(57) ABSTRACT

A PIN device includes: a first doped layer, a second doped layer, and an intrinsic layer between the first doped layer and the second doped layer, where the second doped layer includes a body portion and an electric field isolating portion at least partially enclosing the body portion; and the electric field isolating portion is doped differently from the body portion.

19 Claims, 6 Drawing Sheets

(56) References Cited

U.S. PATENT DOCUMENTS

| | | | | |
|---|---|---|---|---|
| 2007/0114626 A1* | 5/2007 | Kang | ................ | H01L 27/14603 |
| | | | | 257/431 |
| 2014/0138789 A1* | 5/2014 | Lim | ................... | H01L 31/1812 |
| | | | | 257/458 |
| 2015/0171135 A1* | 6/2015 | Jun | ................... | H01L 27/14632 |
| | | | | 250/366 |
| 2016/0172449 A1* | 6/2016 | Suzuki | ................. | H01L 29/267 |
| | | | | 257/77 |
| 2017/0243985 A1* | 8/2017 | Kim | ................... | H01L 27/0814 |
| 2020/0212081 A1* | 7/2020 | Liu | ..................... | H01L 27/1461 |
| 2020/0233103 A1* | 7/2020 | Liang | ....................... | A61B 5/06 |

FOREIGN PATENT DOCUMENTS

| | | | |
|---|---|---|---|
| CN | 107017268 A | | 8/2017 |
| CN | 108321243 | * | 7/2018 |
| CN | 108447937 A | | 8/2018 |

OTHER PUBLICATIONS

Feng Yajie et al., "Effect of Si-based PIN Photodetector Electric Field Isolation Structure on Dark Current," Semiconductor Optoelectronics, vol. 38, No. 6, pp. 802-805 (Year: 2017).*

First Office Action issued to Chinese Application No. 201910233511.0 dated Jun. 19, 2020 with English translation (26p).

Second Office Action issued to Chinese Application No. 201910233511.0 dated Nov. 30, 2020, (9p).

Chinese Office Action issued in CN201910233511.0, dated Apr. 2, 2021, 8 pages.

* cited by examiner

ND MANUFACTURING
PIN DEVICE AND MANUFACTURING METHOD THEREOF, PHOTOSENSITIVE DEVICE AND DISPLAY DEVICE

CROSS-REFERENCE TO RELATED APPLICATIONS

This application is the U.S. national phase of PCT Patent Application No. PCT/CN2019/126653 filed on Dec. 19, 2019, which claims the priority of Chinese Patent Application No. 201910233511.0, filed on Mar. 26, 2019, the entire content of both of which is incorporated herein by reference in their entirety for all purposes.

FIELD

The disclosure relates to the field of optoelectronic technology, and in particular but not limited to a PIN device, a manufacturing method thereof, a photosensitive device, and a display device.

BACKGROUND

A PIN device is a device with an un-doped intrinsic semiconductor region between a p-type semiconductor region and an n-type semiconductor region. The p-type and n-type regions are typically heavily doped because they are used for ohmic contacts.

The PIN device is the core electronic component of optical fingerprint recognition device and X-ray flat panel detector, and its photoelectric performance directly restricts the performance of the whole system.

SUMMARY

Embodiments of the present disclosure provide a PIN device and a manufacturing method thereof, a photosensitive device, and a display device.

According to a first aspect of the present disclosure, there is provided a PIN device, including: a first doped layer, a second doped layer, and an intrinsic layer between the first doped layer and the second doped layer, where the second doped layer includes a body portion and an electric field isolating portion at least partially enclosing the body portion; and the electric field isolating portion is doped differently from the body portion.

According to a second aspect of the present disclosure, there is provided a method of manufacturing a PIN device, including: forming a first doped layer, and an intrinsic layer on the first doped layer; forming a second doped layer on the intrinsic layer, the second doped layer including: a body portion and an electric field isolating portion at least partially enclosing the body portion; and further doping the electric field isolating portion such that the electric field isolating portion is doped differently from the body portion.

According to a third aspect of the present disclosure, there is provided a photosensitive device, including: a substrate; a thin film transistor on the substrate; and at least one of a PIN device which includes: a first doped layer, a second doped layer, and an intrinsic layer between the first doped layer and the second doped layer, where the second doped layer includes a body portion and an electric field isolating portion at least partially enclosing the body portion; and the electric field isolating portion is doped differently from the body portion.

BRIEF DESCRIPTION OF DRAWINGS

A more particular description of the embodiments will be rendered by reference to specific embodiments illustrated in the appended drawings. Given that these drawings depict only some embodiments and are not therefore considered to be limiting in scope, the embodiments will be described and explained with additional specificity and details through the use of the accompanying drawings, in which.

DETAILED DESCRIPTION

Figure 1:
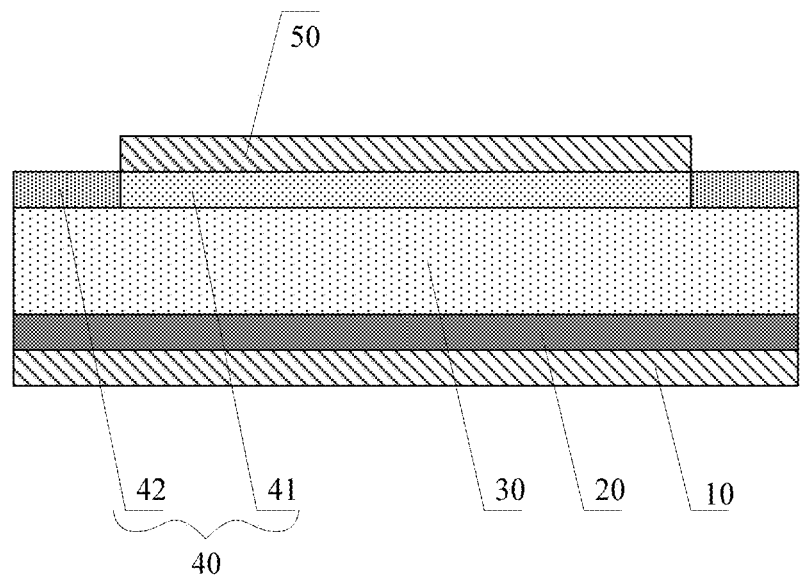
FIG. 1 is a schematic structural diagram of a PIN device according to some embodiments of the present disclosure.

The disclosure will be described hereinafter with reference to the accompanying drawings, which illustrate embodiments of the disclosure. The described embodiments are only exemplary embodiments of the present disclosure, but not all embodiments. Other variations may be derivable by a person of ordinary skill in the art based on the embodiments of the present disclosure without creative efforts, and are within the scope of the present disclosure.

References throughout the disclosure to "one embodiment", "an embodiment", "an example", "some embodiments", or similar language mean that a particular feature, structure, or characteristic described in connection with the embodiment is included in at least one embodiment. Thus, appearances of the phrases "in one embodiment", "in an embodiment", "in some embodiments", and similar language throughout the disclosure may, but do not necessarily, all refer to the same embodiment(s), but mean "one or more embodiments". These may or may not include all the embodiments disclosed. Accordingly, features or elements of some embodiments may be available in some other embodiments unless the context indicates otherwise.

Unless otherwise defined, technical terms or scientific terms used in the embodiments of the present disclosure should be construed in the ordinary meaning of the person of ordinary skill in the art.

The terms "first", "second" and similar terms used in the present disclosure do not denote any order, quantity, or importance. They are merely used for references to relevant devices, components, procedural steps, etc. These terms do not imply any spatial or chronological orders, unless expressly specified otherwise. For example, a "first device" and a "second device" may refer to two separately formed devices, or two parts or components of the same device. In some cases, for example, a "first device" and a "second device" may be identical, and may be named arbitrarily. Similarly, a "first step" of a method or process may be carried or performed before, after, or simultaneously with, a "second step".

The terms "comprising", "including", "having", and variations thereof mean "including but not limited to", unless expressly specified otherwise.

An enumerated listing of items does not imply that any or all of the items are mutually exclusive, unless expressly specified otherwise. The terms "a", "an", and "the" also refer to "one or more" unless expressly specified otherwise.

The words "connected" or "connection" and the like are not limited to physical or mechanical connections, but may include electrical connections, whether direct or indirect.

The words "above", "below", "under", "upper", "lower", "left", "right", etc., may be used to refer to relative positions of an element under normal operation mode or installation orientation, to facilitate understanding of the relevant embodiments. The scope of the disclosure is not limited to the specific operation mode or installation orientation as described.

The steps illustrated in the flowcharts of the drawings may be executed by a computer system such as a set of computer executable instructions. Although logical sequences are shown in the flowcharts, in some cases, the steps shown or described may be performed in a different order than the ones described herein.

The drawings of the present disclosure relate only to structures involved in the present disclosure, and other structures may refer to the usual design.

In the drawings used to describe the embodiments of the present disclosure, the thickness and size of layers or microstructures are exaggerated. It will be understood that when an element such as a layer, a film, a region or a substrate is referred to as being "on" or "below" another element, the element may be "directly on" or "directly below" the another element, or there may be intermediate elements.

According to some studies, certain damage may be caused to sidewall of a PIN device during the manufacturing process, resulting in an increase in dark current in the PIN device, thereby reducing the switching ratio and performance of the PIN device.

Embodiments of the present disclosure provide a PIN device and a manufacturing method thereof, a photosensitive device, and a display device, which can reduce the increase in the dark current due to the damage of the sidewall of the PIN device, thereby improving the switching ratio and performance of the PIN device.

Figure 2:
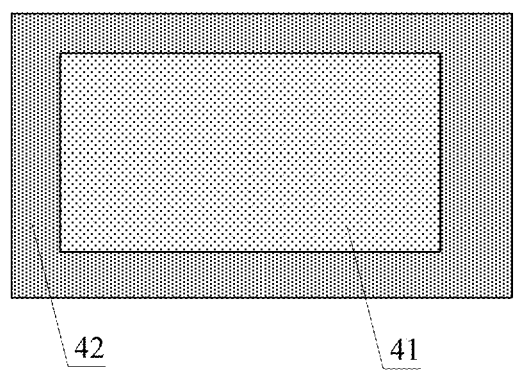
FIG. 2 is a plan view of a second doped layer according to some embodiments of the present disclosure.

Some embodiments of the present disclosure provide a PIN device. FIG. 1 is a schematic diagram showing a structure of a PIN device, and FIG. 2 is a top view of a second doped layer of the PIN device. As shown in FIG. 1 and FIG. 2, the PIN device according to some embodiments of the present disclosure includes a first electrode 10, a first doped layer 20, an intrinsic layer 30, a second doped layer 40, and a second electrode 50, which are sequentially disposed.

The second doped layer 40 includes a body portion 41 and an electric field isolating portion 42 disposed in a same layer, and the electric field isolating portion 42 at least partially encloses, or surrounds, the body portion 41 to isolate an electric field which would be formed on the sidewall of the PIN device due to damage caused during the manufacturing process.

The electric field isolating portion 42 may partially surround the body portion 41, or completely surround the body portion 41. For example, FIG. 2 shows an example in which the electric field isolating portion 42 encloses the entire body portion 41. The electric field isolating portion 42 directly contacts with the body portion 41.

As shown in FIG. 1, the orthographic projections of the first doped layer 20, the intrinsic layer 30 and the second doped layer 40 on the lower electrode 10 coincide. The orthographic projection of the body portion 41 on the lower electrode 10 is separated from, or does not overlap with, the orthographic projection of the electric field isolating portion 42 on the lower electrode 10. The orthographic projection of the electric field isolating portion 42 on the lower electrode 10 does not overlap with the orthographic projection of the upper electrode 50 on the lower electrode 10, that is, the upper electrode 50 (i.e. the second electrode) does not cover the electric field isolation portion 42. The area of the lower electrode 10 is greater than or equal to the area of the first doped layer 20, that is, if the PIN device is disposed on a substrate, the orthographic projection of the lower electrode 10 on the substrate completely covers the orthographic projection of the first doped layer 20 on the substrate.

Optionally, the first doped layer 20 may be a p-type semiconductor layer, or it may be an n-type semiconductor layer. Optionally, the first doped layer 20 may have a thickness of 200-700 angstroms.

Optionally, the intrinsic layer 30 may be an intrinsic amorphous silicon layer or an intrinsic germanium layer, etc. The intrinsic layer 30 may have a thickness of 5000 to 15000 angstroms. It should be noted that the doping concentration of the intrinsic layer 30 may be very low, so that the absorption coefficient of the intrinsic layer 30 is small, and the light incident on the intrinsic layer may easily enter and be sufficiently absorbed to generate a large number of electron-hole pairs. Therefore, it may achieve a high photoelectric conversion efficiency.

Optionally, the body portion 41 may be a p-type semiconductor layer. It may also be an n-type semiconductor layer. When the first doped layer 20 is a p-type semiconductor layer, the body portion 41 is an n-type semiconductor layer; when the first doped layer 20 is an n-type semiconductor layer, the body portion 41 is a p-type semiconductor layer.

The thickness of the body portion 41 and the electric field isolating portion 42 may be the same. The second doped layer 40 may have a thickness of 200 to 700 angstroms.

In the embodiment, the body portion 41 is configured to cooperate with the upper electrode 50, the lower electrode 10, the first doped layer 20, and the intrinsic layer 30 to form a built-in electric field of the PIN device. In the embodiment, since the electric field isolating portion 41 at least partially encloses the body portion, the built-in electric field of the PIN device may be shrunk, which in turn is able to isolate the sidewall electric field that would be formed in the PIN device. Therefore, it may significantly reduce the dark current due to the damage of the sidewall of the PIN device, and in some cases, the reduction is at least by an order of magnitude.

In the embodiment, the working principle of the PIN device is that the intrinsic layer 30 is used to generate a large number of electron-hole pairs after absorbing incident light. Under the effect of a strong electric field, the electrons of the electron-hole pairs in the intrinsic layer drift toward the n-type semiconductor layer, and the holes drift toward the p-type semiconductor layer, thereby forming a photocurrent and converting an optical signal into an electrical signal.

According to the embodiment of the present disclosure, there is provided a PIN device, the PIN device including: a lower electrode, a first doped layer, an intrinsic layer, a second doped layer, and an upper electrode disposed in sequence; and the second doped layer includes: a body portion and an electric field isolating portion disposed in the same layer, the electric field isolating portion at least partially enclosing or surrounding the body portion to isolate an electric field formed on a sidewall of the PIN device.

In the embodiment, the electric field isolating portion of the second doped layer at least partially surrounding the body portion is capable of isolating an electric field formed on the sidewall of the PIN device, thereby reducing a dark current increase due to damages or defects on the sidewall of the PIN device and improving the switching ratio and performance of the PIN device.

According to some embodiments of the present disclosure, a PIN device includes a first doped layer 20, a second doped layer 40, and an intrinsic layer 30 between the first doped layer 20 and the second doped layer 40; the second doped layer includes a body portion 41 and an electric field isolating portion 42 at least partially enclosing the body portion 41; and the electric field isolating portion 42 is doped differently from the body portion 41 of the second doped layer 40.

The electric field isolating portion 42 may be reversely doped with respect to the body portion 41 to isolate the electric field formed on the sidewall of the PIN device. The electric field isolating portion 42 may have an effective concentration of dopants higher than that of the first doped layer 20. The electric field isolating portion 42 may have an effective concentration of dopants higher than that of the body portion 41.

Figure 3:
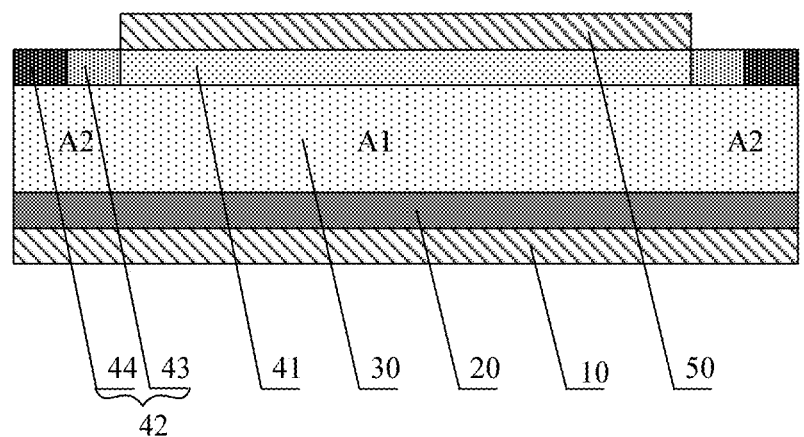
FIG. 3 is a schematic structural diagram of a PIN device according to some embodiments of the present disclosure.
Figure 4:
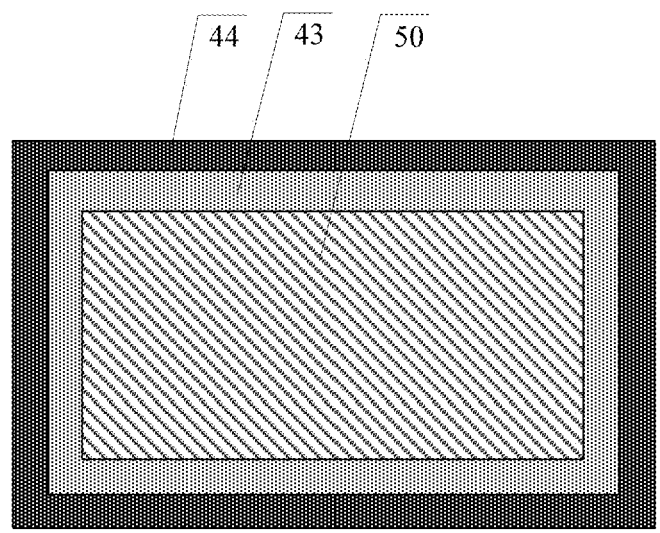
FIG. 4 is a plan view of a PIN device according to some embodiments of the present disclosure.

FIG. 3 is a schematic diagram showing a structure of a PIN device according to some embodiments of the present disclosure. FIG. 4 is a top view of the PIN device. The electric field isolating portion 42 includes a first doped portion 43 (i.e. a first further doped portion) and a second doped portion 44 (i.e. a second further doped portion) disposed in the same layer; the first doped portion 43 at least partially surrounds or partially encloses the body portion 41, and the second doped portion 44 at least partially surrounds or encloses the first doped portion 43. The first further doped portion 43 directly contacts with the body portion 41.

The first doped portion 43 may partially surround the body portion 41, or it may completely surround the body portion 41. For example, FIG. 3 illustrates an example in which the first doped portion 43 entirely surrounds, or encloses the body portion 41. The disclosure does not limit to this. The second doped portion 44 may partially surround the first doped portion 43, or it may completely surround the first doped portion 43. As illustrated in FIG. 3 as an example, the second doped portion 44 entirely surrounds, or encloses the first doped portion 43. The present disclosure does not limit to this.

In the embodiment, as shown in FIG. 3 and FIG. 4, there is no overlapping area between the orthographic projection of the body portion 41 on the lower electrode 10 and the orthographic projection of the first doped portion 43 on the lower electrode 10. There is no overlap between the orthographic projection of the body portion 41 on the lower electrode 10 and the orthographic projection of the second doped portion 44 on the lower electrode 10. There is also no overlapping area between the orthographic projection of the first doped portion 43 on the lower electrode 10 and the orthographic projection of the second doped portion 44 on the lower electrode 10.

In order to ensure that the built-in electric field of the PIN device is not affected by the electric field isolating portion, as shown in FIG. 3, the orthographic projection of the body portion 41 on the lower electrode 10 in the embodiment covers the orthographic projection of the upper electrode 50 on the lower electrode 10. FIG. 4 is an example in which the orthographic projection of the body portion 41 on the lower electrode 10 completely overlaps with the orthographic projection of the upper electrode 50 on the lower electrode 10.

In an embodiment, the first doped layer 20 is an n-type semiconductor layer; the body portion 41 and the first doped portion 43 are p-type semiconductor layers; and the second doped portion 44 is an n-type semiconductor layer. That is, the second doped portion 44 is reversely doped with respect to the body portion 41. The hole concentration of the first doped portion 43 is greater than the hole concentration of the doped body portion 41, and the free electron concentration of the second doped portion 44 is greater than the free electron concentration of the first doped layer 20.

In another embodiment, the first doped layer 20 is a p-type semiconductor layer; the body portion 41 and the first doped portion 43 are n-type semiconductor layers; and the second doped portion 44 is a p-type semiconductor layer. That is, the second doped portion 44 is reversely doped with respect to the body portion 41. The free electron concentration of the first doped portion 43 is greater than the free electron concentration of the body portion 41, and the hole concentration of the second doped portion 44 is greater than the hole concentration of the first doped layer 20.

That is, the second doped portion 44 has an effective concentration of dopants higher than that of the first doped layer 20; the first doped portion 43 is reversely doped with respect to the second doped portion 44, and has an effective concentration of dopants higher than that of the body portion 41; and the second doped portion 44 has an effective concentration of dopants higher than that of the body portion 41.

In another example, the first doped portion 43 may be reversely doped with respect to the second further doped portion 44, and may have an effective concentration of dopants approximately equal to zero.

Figure 5:
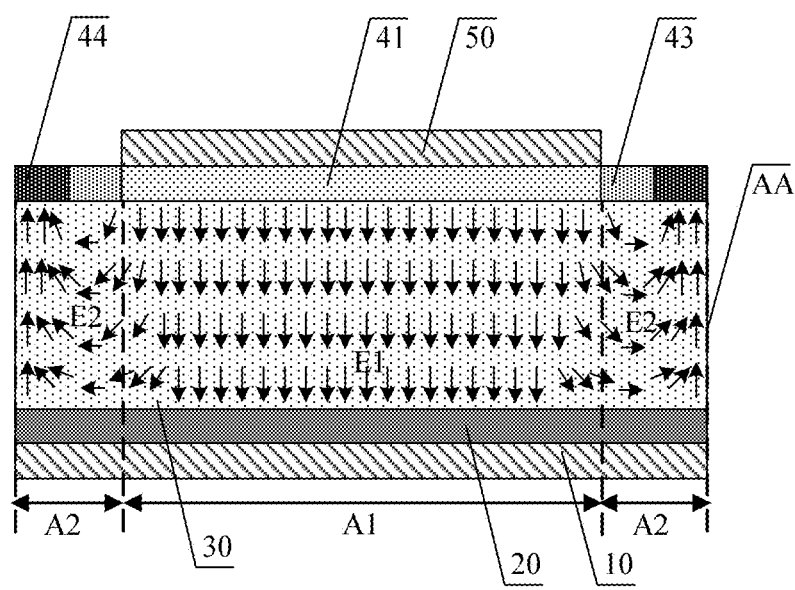
FIG. 5 is a schematic diagram illustrating electric fields of a PIN device according to some embodiments of the present disclosure.

FIG. 5 is a schematic diagram illustrating electric fields of a PIN device according to some embodiments of the present disclosure. As shown in FIG. 5, the intrinsic layer 30 includes: a first region A1 and a second region A2. The orthographic projection of A1 on the lower electrode 10 coincides with the orthographic projection of the body portion 41 on the lower electrode 10, and the orthographic projection of the second region A2 on the lower electrode 10 coincides with the orthographic projections of the first doped portion 43 and the second doped portion 44 on the lower electrode 10.

As shown in FIG. 5, in the embodiment, a first electric field E1 is formed in the first region A1 under the effects of the upper electrode 50 and the lower electrode 10, that is, the built-in electric field of the PIN device; and a second electric field E2 is formed in the second region A2 under the effects of the first doped portion 43 and the second doped portion 44. The second electric field E2 isolates an electric field formed on the sidewall AA of the PIN device from the first electric field E1.

It should be noted that in the example shown in FIG. 5, the first doped layer 20 is an n-type semiconductor layer; the body portion 41 and the first doped portion 43 are p-type semiconductor layers; and the second doped portion 44 is an n-type semiconductor layer.

In the embodiment, the second doped portion 44 has a higher free electron concentration, which corresponds to a negative electrode; and the first doped portion 43 has a higher hole concentration, corresponding to a positive electrode. Even there are no electrodes in contact with the first doped portion 43 and the second doped portion 44, the first doped portion 43 and the second doped portion 44 may form the second electric field E2 in the second region A2 with an upward field direction, i.e. the direction of the second electric field E2 is from bottom to top as shown in FIG. 5. Since the first doped layer 20 is an n-type semiconductor layer and the body portion 41 is a p-type semiconductor layer, under the effect of the upper electrode and the lower electrode, the direction of the first electric field E1 formed is downward, i.e. from top to bottom. The first electric field E1 and the second electric field E2 are in opposite directions.

In another embodiment, the first doped layer 20 is a p-type semiconductor layer; the body portion 41 and the first doped portion 43 are n-type semiconductor layers; and the second doped portion 44 is a p-type semiconductor layer. Here, the first doped portion 43 has a higher free electron concentration, which corresponds to a negative electrode, and the second doped portion 44 has a higher hole concentration, corresponding to a positive electrode. Even there are no electrodes on the first doped portion 43 and the second doped portion, the first doped portion 43 and the second doped portion 44 may form a second electric field E2 in the second region A2 with a downward field direction, i.e. the direction of the second electric field E2 is from top to bottom. Since the first doped layer 20 is a p-type semiconductor layer and the body portion 41 is an n-type semiconductor layer, under the effect of the upper electrode and the lower electrode, the direction of the first electric field E1 formed is upward, i.e. from bottom to top. The electric field direction of the first electric field E1 is opposite to the electric field direction of the second electric field E2.

It should be noted that the field intensity of the first electric field E1 depends on the voltages applied to the upper electrode and the lower electrode, and the field intensity of the second electric field E2 depends on the amount and depth of the doping materials doped in the first doped portion and the second doped portion. The details may be determined based on actual requirements, and the present disclosure does not limit this.

In the embodiment of the present disclosure, by including the first doped portion 43 and the second doped portion 44 in the second doped layer 40, the second electric filed for isolating electric fields inside the PIN device can be formed in the second region A2 of the intrinsic layer 30, thereby isolating the electric field of the sidewall of the PIN device from the first electric field. The field directions of the first electric field and the second electric field are opposite. Since the dark current direction is consistent with the direction of the electric field, the dark current directions of the first electric field and the second electric field are also opposite, and thus the dark current of the second electric field can neutralize the dark current of the first electric field, thereby further reducing the dark current in the PIN device such that the dark current in the PIN device can be reduced by more than an order of magnitude. For example, there is data indicating that the dark current level of the PIN device is $10e^{-13}$ amps when the second electric field is not formed, and the dark current level is reduced to $10e^{-14}$~$10e^{-15}$ amps when the second electric field is formed.

Figure 6:
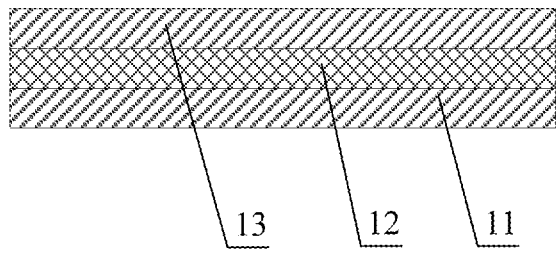
FIG. 6 is a schematic structural diagram of a lower electrode according to some embodiments of the present disclosure.

Optionally, FIG. 6 is a schematic structural diagram of the lower electrode according to an embodiment of the present disclosure. As shown in FIG. 6, the lower electrode 10 includes a first protective layer 11, a second protective layer 13 and a metal layer 12 disposed between the first protective layer 11 and the second protective layer 13, in which the second protective layer 13 is located on a side of the first protective layer 11 away from the first doped layer 20.

Optionally, the material of the first protective layer 11 and the second protective layer 13 includes: molybdenum or titanium.

Optionally, the material of metal layer 12 includes copper, aluminum or aluminum telluride.

The lower electrode in the embodiment has a three-layer structure including a first protective layer, a second protective layer, and a metal layer therebetween, such that the metal layer is protected from the upper and lower sides. The present disclosure does not specifically limit this.

The lower electrode 10 is a planar electrode in the example. The shape and size of the planar electrode are not specifically limited by the example, and may be determined according to the actual requirements.

Optionally, the upper electrode 50 is made of a transparent conductive material, for example, indium tin oxide. The upper electrode 50 is a planar electrode in the example. The shape and size of the planar electrode are not specifically limited by the example, and may be determined according to actual requirements.

Figure 7:
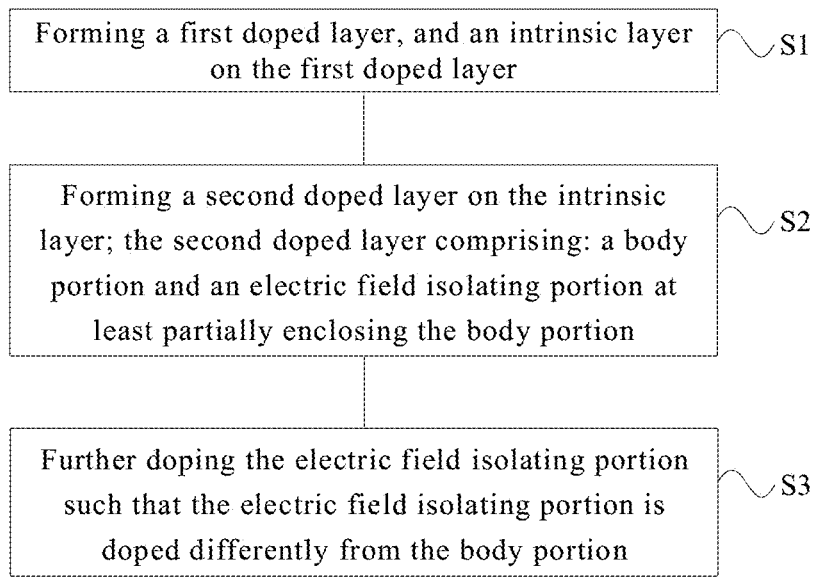
FIG. 7 is a flowchart showing a method of manufacturing a PIN device according to some embodiments of the present disclosure.

Some embodiments of the present disclosure also provide a method of manufacturing a PIN device. FIG. 7 is a flowchart of a method of manufacturing a PIN device according to an embodiment of the present disclosure. As shown in FIG. 7, the method of manufacturing the PIN device according to the embodiment of the present disclosure includes the following steps.

Step S1: forming a first doped layer, and an intrinsic layer on the first doped layer.

The first doped layer may be formed by patterning a first doped semiconductor film; and the intrinsic layer may be formed by depositing an intrinsic semiconductor film on the first doped layer, and patterning the intrinsic semiconductor film.

Step S2: forming a second doped layer on the intrinsic layer.

The second doped layer includes: a body portion and an electric field isolating portion at least partially enclosing the body portion. The second doped layer may be formed by depositing a second doped semiconductor film on the intrinsic layer, and patterning the second doped semiconductor film.

The first doped semiconductor film, the intrinsic semiconductor film, and the second doped semiconductor film may be deposited by a sputtering process.

Step S3: further doping the electric field isolating portion such that the electric field isolating portion is doped differently from the body portion.

The method of manufacturing the PIN device may further include providing a substrate; and forming a first electrode or a lower electrode on the substrate.

The first electrode is a planar electrode, for example.

The first doped layer is formed on the first electrode; and the first electrode includes a first protective film, a metal film, and a second protective film.

The method may further include: forming a conductive layer on the second doped layer; patterning the conductive layer to form a second electrode covering the body portion of the second doped layer, and exposing the electric field isolating portion of the second doped layer; doping the electric field isolating portion of the second doped layer with a dopant different from that of the body portion (i.e. a dopant of a different type, for example, p-type dopant or n-type dopant). Doping the electric field isolating portion may include masking a first portion of the electric field isolating portion, and doping the electric field isolating portion with a dopant different from that of the body portion to form a second further doped portion; and masking a second portion of the electric field isolating portion, and doping the electric field isolating portion with a dopant same as (i.e. a dopant of a same type) that of the body portion to form a first further doped portion.

The second electrode may be made of a transparent material.

According to some embodiments of the present disclosure, another method of manufacturing a PIN device includes:

Step S10: forming a lower electrode.

The lower electrode is a planar electrode, for example.

Forming the lower electrode includes: depositing a first protective film, a metal film and a second protective film respectively, and forming a lower electrode including a first protective layer, a metal layer and a second protective layer by a patterning process.

It should be noted that the patterning process includes photoresist coating, exposure, development, etching, photoresist stripping and the like.

Step S20: forming a first doped layer, an intrinsic layer, a second doped layer, and an upper electrode on the lower electrode.

The second doped layer includes: a body portion and an electric field isolating portion disposed in the same layer, the electric filed isolating portion at least partially enclosing or surrounding the body portion to isolate an electric field formed on a sidewall of the PIN device.

The upper electrode is a planar electrode.

The step S20 includes: depositing a first doped semiconductor film on the lower electrode, and forming a first doped layer by a patterning process; depositing an intrinsic semiconductor film on the first doped layer, and forming an intrinsic layer by a patterning process; depositing a second doped semiconductor film on the intrinsic layer, and forming a doped body layer by a patterning process; depositing a transparent conductive film on the doped body layer, and forming an upper electrode by a patterning process; doping in the doped body layer a first sub-doped material and a second sub-doped material to form a second doped layer including a body portion, a first doped portion, and a second doped portion.

The first doped semiconductor film, the intrinsic semiconductor film, and the second doped semiconductor film may be deposited by a sputtering process.

The method for manufacturing a PIN device according to the embodiment of the present disclosure includes: forming a lower electrode; forming a first doped layer, an intrinsic layer, a second doped layer, and an upper electrode on the lower electrode; and the second doped layer includes: a body portion and an electric field isolating portion disposed in a same layer, the electric field isolating portion at least partially enclosing or surrounding the body portion to isolate an electric field formed on a sidewall of the PIN device. In the embodiments of the present disclosure, the electric field isolating portion at least partially surrounding the body portion included in the second doped layer is capable of isolating the electric field formed on the sidewall of the PIN device, thereby reducing the dark current increase due to the damage of the sidewall of the PIN device, and improving the switching ratio and performance of the PIN device.

Taking the first doped layer as the n-type semiconductor layer as an example and with reference to FIG. 8 to FIG. 11, a method for manufacturing the PIN device according to an embodiment of the present disclosure includes the following steps.

Figure 8:
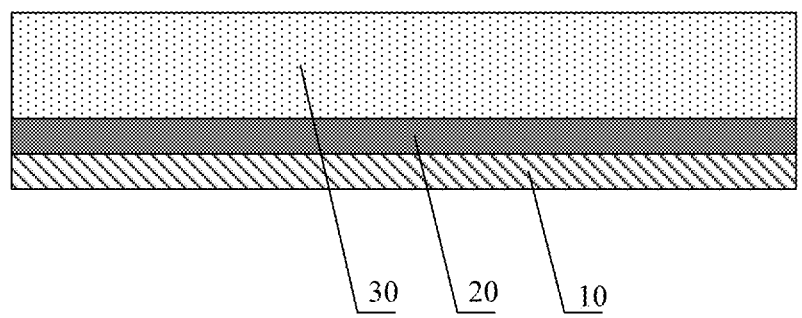
FIG. 8 is a schematic diagram illustrating a step of a method of manufacturing a PIN device according to some embodiments of the present disclosure.

Step 100: forming sequentially a lower electrode 10, a first doped layer 20, and an intrinsic layer 30, as shown in FIG. 8.

Figure 9:
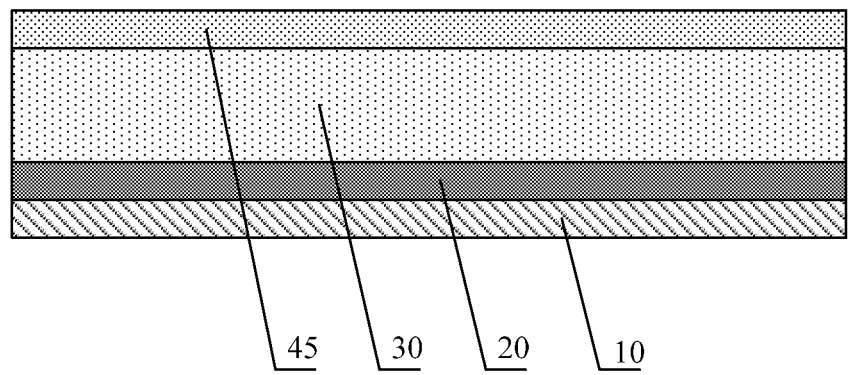
FIG. 9 is a schematic diagram illustrating a step of the method of manufacturing the PIN device.

Step 200: depositing a p-type semiconductor material on the intrinsic layer 30, and forming a doped body layer 45 by a patterning process, as shown in FIG. 9.

Figure 10:
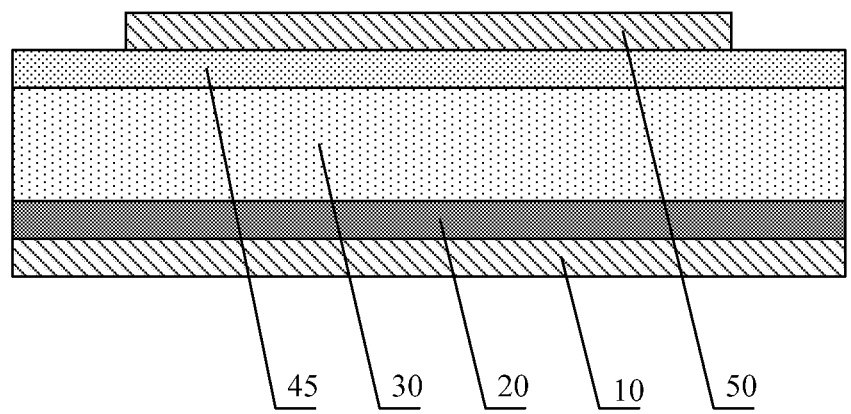
FIG. 10 is a schematic diagram illustrating a step of the method of manufacturing the PIN device.

Step 300: depositing a transparent conductive material on the doped body layer 45, and forming an upper electrode 50 by a patterning process, as shown in FIG. 10.

The orthographic projection of the upper electrode 50 on the intrinsic layer 30 is covered by the orthographic projection of the lower electrode 10 on the intrinsic layer 30.

Figure 11:
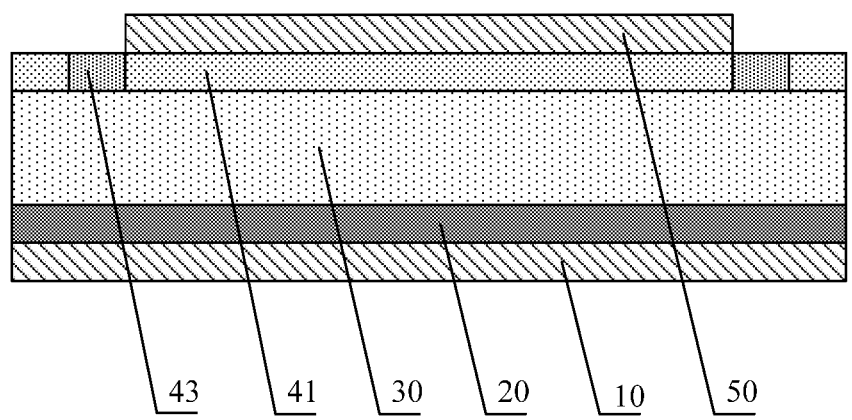
FIG. 11 is a schematic diagram illustrating a step of the method of manufacturing the PIN device.

Step 400: doping the doped body layer 45 with a first sub-doped material to form a body portion 41 and a first doped portion 43 at least partially surrounding or enclosing the body portion 41, as shown in FIG. 11.

The first doped portion 43 is a p-type semiconductor layer, and the hole concentration of the first doped portion 43 is greater than the hole concentration of the body portion 41.

Step 500: doping the doped body layer 45 with a second sub-doped material to form a second doped portion 44 at least partially surrounding or enclosing the first doped portion 43, as shown in FIG. 3.

The second doped portion 44 is an n-type semiconductor layer, and the free electron concentration of the second doped portion 44 is greater than the free electron concentration of the first doped layer 20.

It should be noted that when the first doped layer 20 is a p-type semiconductor layer, the body portion 41 is an n-type semiconductor layer, the first doped portion 43 is an n-type semiconductor layer, and the second doped portion 44 is a p-type semiconductor layer. The manufacturing method is similar to the above, and will not be described here.

Figure 12:
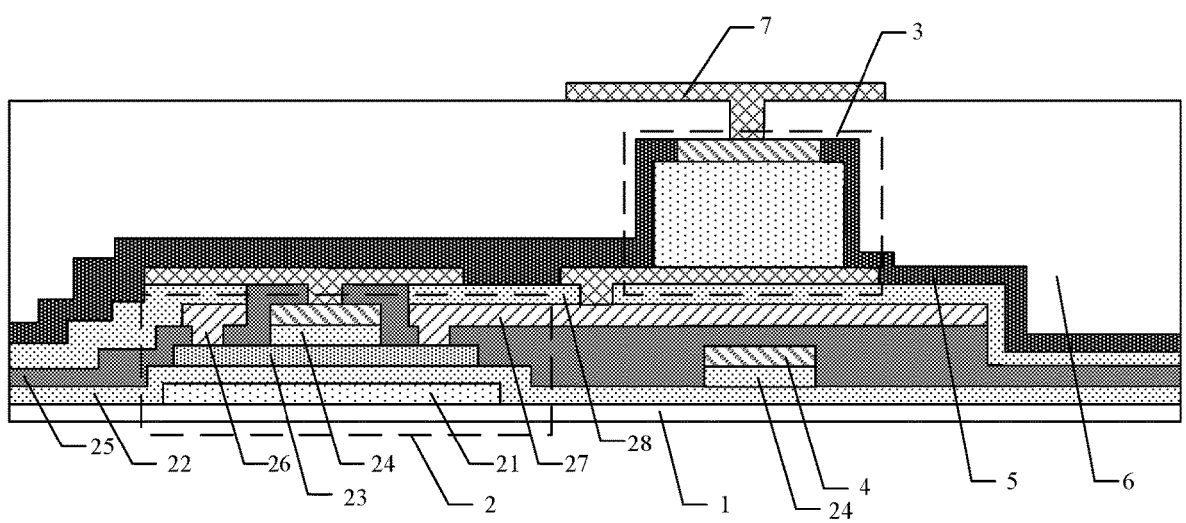
FIG. 12 is a schematic structural diagram of a photosensitive device according to some embodiments of the present disclosure.

Some embodiments of the present disclosure also provide a photosensitive device PD. FIG. 12 is a schematic structural diagram of the photosensitive device PD according to an embodiment of the present disclosure. As shown in FIG. 12, the photosensitive device PD includes: a substrate 1, a thin film transistor 2 and the PIN device 3 provided on the substrate 1. A protection layer 5 may be provided to surround the PIN device 3 and a planarization layer 6 may be provided to smooth a surface of the photosensitive device. The second electrode of the PIN device is connected to a bias line 7 to receive a bias voltage.

The thin film transistor 2 includes: a gate electrode 21, a gate insulating layer 22, an active layer 23, a buffer layer 24, an interlayer insulating layer 25, a source electrode 26, a drain electrode 27, and a passivation layer 28. The thin film transistor may have a top gate structure or a bottom gate structure. A top gate structure is shown in FIG. 12 as an example.

The first electrode 10 of the PIN device 3 is connected to the drain electrode 27 of the thin film transistor 2.

Optionally, the photosensitive device can be used in various applications, for example, to form an imaging element or the like, to implement a touch function or a fingerprint recognition function based on the principle of photo-sensing, etc. For example, the above functions may be integrated in a display panel by micro-nano electronic process technology, thereby obtaining a display panel with a touch function, a display panel having a fingerprint recognition function, or the like. The photosensitive device may also be used in an X-ray flat panel sensor.

Some embodiments of the present disclosure further provide a display device including the photosensitive device.

Optionally, the display device may be a liquid crystal display, or an Organic Light-Emitting Diode (OLED) display device.

The display device may be any product or component having a display function, such as a mobile phone, a tablet computer, a television, a monitor, a notebook computer, a digital photo frame, a navigator, and the like.

Various embodiments and/or examples are disclosed to provide exemplary and explanatory information to enable a person of ordinary skill in the art to put the disclosure into practice. Features or components disclosed with reference to one embodiment or example are also applicable to all embodiments or examples unless specifically indicated otherwise.

Although the disclosure is described in combination with specific embodiments, it is to be understood by the person skilled in the art that many changes and modifications may be made and equivalent replacements may be made to the components without departing from a scope of the disclosure. Embodiments may be practiced in other specific forms. The described embodiments are to be considered in all respects only as illustrative and not restrictive.

What is claimed is:

1. A PIN device, comprising:
   a first doped layer, a second doped layer, an intrinsic layer between the first doped layer and the second doped layer, and a second electrode on a side of the second doped layer away from the intrinsic layer,
   wherein the second doped layer includes a body portion and an electric field isolating portion at least partially enclosing the body portion; the electric field isolating portion is doped differently from the body portion, and the electric field isolating portion directly contacts with the body portion,
   wherein an orthographic projection of the body portion on the first doped layer has a size to that is identical to an orthographic projection of the second electrode on the first doped layer, and a cross-sectional area of the body portion along a surface of the intrinsic layer is identical to a cross-sectional area of the second electrode along the surface of the intrinsic layer.

2. The PIN device according to claim 1, wherein the electric field isolating portion is reversely doped with respect to the body portion.

3. The PIN device according to claim 1, wherein the electric field isolating portion has an effective concentration of dopants higher than that of the body portion.

4. The PIN device according to claim 1, wherein the electric field isolating portion comprises: a first further doped portion and a second further doped portion; wherein the second further doped portion is reversely doped with respect to the body portion.

5. The PIN device according to claim 4, wherein the first further doped portion at least partially encloses the body portion, and the second further doped portion at least partially encloses the first further doped portion; wherein the second further doped portion has an effective concentration of dopants higher than that of the body portion.

6. The PIN device according to claim 5, wherein the second further doped portion has an effective concentration of dopants higher than that of the first doped layer.

7. The PIN device according to claim 5, wherein the first further doped portion is reversely doped with respect to the second further doped portion, and has an effective concentration of dopants higher than that of the body portion.

8. The PIN device according to claim 1, wherein the intrinsic layer comprises: a first region corresponding to the body portion having a first electric field and a second region corresponding to the electric field isolating portion having a second electric field in a reverse direction with respect to the first electric field.

9. The PIN device according to claim 1, wherein one of the first doped layer and the body portion of the second doped layer is an n-type semiconductor layer, and the other one is a p-type semiconductor layer.

10. The PIN device according to claim 1, further comprising a first electrode on a side of the first doped layer away from the intrinsic layer; wherein the second electrode is made of a transparent conductive material.

11. The PIN device according to claim 10, an orthographic projection of the second electrode on the first electrode does not overlap with an orthographic projection of the electric field isolation portion on the first electrode.

12. The PIN device according to claim 10, wherein the first electrode comprises: a first protective layer, a second protective layer, and a metal layer between first protective layer and the second protective layer.

13. The PIN device according to claim 12, wherein the material of the first protective layer and the second protective layer comprises: molybdenum or titanium.

14. The PIN device according to claim 12, wherein the metal layer is made of copper, aluminum or aluminum telluride.

15. A photosensitive device, comprising:
   a substrate;
   a thin film transistor on the substrate; and
   at least one PIN device which comprises:
   a first doped layer, a second doped layer, an intrinsic layer between the first doped layer and the second doped layer, and a second electrode on a side of the second doped layer away from the intrinsic layer,
   wherein the second doped layer includes a body portion and an electric field isolating portion at least partially enclosing the body portion; and the electric field isolating portion is doped differently from the body portion, and the electric field isolating portion directly contacts with the body portion,
   wherein an orthographic projection of the body portion on the first doped layer has a size to that is identical to an orthographic projection of the second electrode on the first doped layer, and a cross-sectional area of the body portion along a surface of the intrinsic layer is identical to a cross-sectional area of the second electrode along the surface of the intrinsic layer.

16. The photosensitive device according to claim 15, further comprising a bias line configured to receive a bias voltage, wherein
   a first electrode of the PIN device is connected to an electrode of the thin film transistor; and
   the second electrode of the PIN device is connected to the bias line.

17. A method of manufacturing a PIN device, comprising:
   forming a first doped layer, and an intrinsic layer on the first doped layer;
   forming a second doped layer on the intrinsic layer, the second doped layer comprising: a body portion and an electric field isolating portion at least partially enclosing the body portion, wherein the electric field isolating portion directly contacts with the body portion;

forming a second electrode on a side of the second doped layer away from the intrinsic layer, wherein an orthographic projection of the body portion on the first doped layer has a size to that is identical to an orthographic projection of the second electrode on the first doped layer, and a cross-sectional area of the body portion along a surface of the intrinsic layer is identical to a cross-sectional area of the second electrode along the surface of the intrinsic layer; and further doping the electric field isolating portion such that the electric field isolating portion is doped differently from the body portion.

18. The method of claim 17, further comprising:

providing a substrate; and forming a first electrode on the substrate;

wherein the first doped layer is formed on the first electrode; and the first electrode comprising a first protective film, a metal film, and a second protective film.

19. The method according to claim 17, further comprising:

forming a conductive layer on the second doped layer; and patterning the conductive layer to form the second electrode covering the body portion of the second doped layer and exposing the electric field isolating portion of the second doped layer.

\* \* \* \* \*